Jan. 24, 1967 J. A. PERRI ETAL 3,300,339

METHOD OF COVERING THE SURFACES OF OBJECTS WITH PROTECTIVE GLASS JACKETS AND THE OBJECTS PRODUCED THEREBY

Filed Dec. 31, 1962

INVENTORS
JOHN A. PERRI
JACOB RISEMAN
RUDY L. RUGGLES, JR.

BY Everett A. Gartrell

ATTORNEY

United States Patent Office 3,300,339

Patented Jan. 24, 1967

3,300,339

METHOD OF COVERING THE SURFACES OF OBJECTS WITH PROTECTIVE GLASS JACKETS AND THE OBJECTS PRODUCED THEREBY

John A. Perri, Jacob Riseman, and Rudy L. Ruggles, Jr., Poughkeepsie, N.Y., assignors to International Business Machines Corporation, New York, N.Y., a corporation of New York Filed Dec. 31, 1962, Ser. No. 248,530
15 Claims. (Cl. 117—215)

Figure 1A:
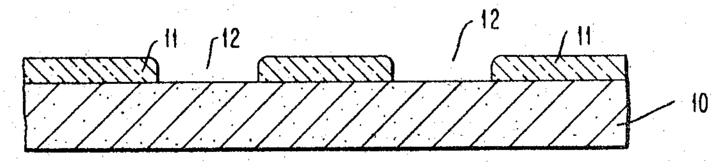
Figure 1B:
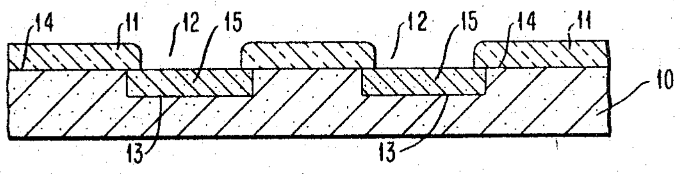
Figure 1C:
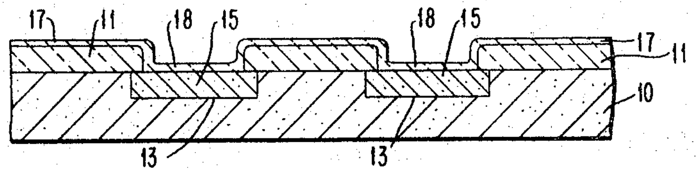
Figure 1D:
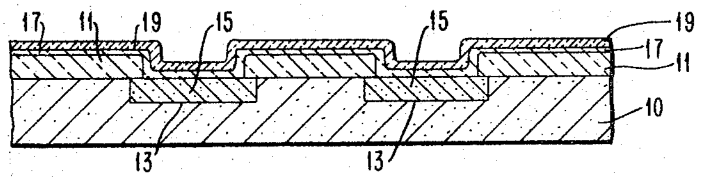
Figure 1E:
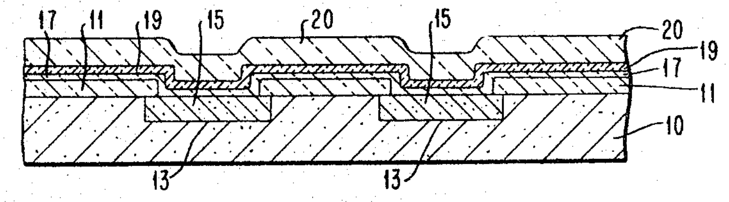
Figure 1F:
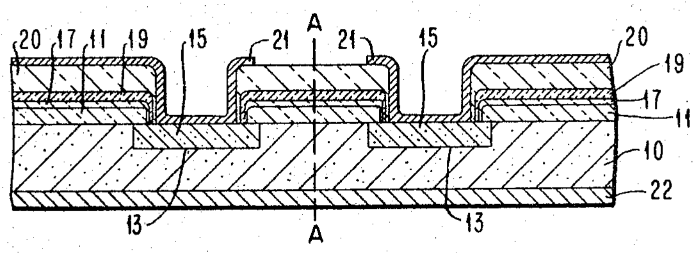

The present invention is directed to the methods of covering surfaces of objects with protective glass jackets and the objects produced thereby. More particularly, the invention relates to the methods of providing thin glass jackets for preserving the operating characteristics of various electrical devices such as semiconductor diodes and transisitors which have PN junctions that extend to the surface thereof. Accordingly, the invention will be described primarily in that environment.

Semiconductor diodes and transistors for use in various applications such as in computers are made to exacting specifications to assure desired electrical characteristics and to provide precise performance. To retain those characteristics, it is necessary to protect the surfaces about the exposed junctions from conditions which would impair their characteristics or would otherwise damage or destroy the devices. Moisture and other surface contaminants are detrimental to the proper operation of semiconductor devices. For several years, intense efforts have been extended with germanium and silicon devices, especially the latter, to combat those contaminants by physically or chemically passivating the exposed surfaces of the devices. Those efforts have included the formation of oxides on the surfaces of the devices or oxides in conjunction with surface treatments to effect an esterification of silanol groups on the device surfaces. Also, physical treatments of these devices have involved encapsulating them in various plastics or combinations of oxides and plastics. Other encapsulating media have included low melting point glasses such as those found in the arsenic-sulphur system and have also included high lead-silicate glasses.

While the various techniques mentioned above have been moderately successful in protecting PN junctions for some purposes, they have not proved to be as effective as may be desired for many applications. More particularly, the encapsulating procedures have not afforded adequate junction protection in some environments or have resulted in protective jackets that are too bulky for micro-miniaturization purposes.

Heretofore it has been determined that when a thin adherent silicon dioxide film is produced over the exposed PN junction or junctions of a semiconductor device, that junction is passivated and becomes fully protected from the action of junction-impairing contaminants when a thin impervious coating of glass is chemically bonded to the silicon dioxide film. Semiconductor devices with protective PN junctions and the techniques for protecting them with silicon dioxide films and chemically bonded glass coatings are disclosed and claimed in the copending application of John A. Perri and Jacob Riseman, Serial No. 141,669, entitled "Coated Objects and Methods of Providing Protective Coverings Therefor" and the copending application of William A. Pliskin and Ernest E. Conrad, Serial No. 141,668, now Patent 3,212,921, entitled "Method of Forming a Glass Film on an Object and the Product Produced Thereby," both applications having been filed September 29, 1961 and assigned to the same assignee as the present invention. While the procedures disclosed in those cases have proved to be very satisfactory, the method of the present invention affords certain advantages to be considered hereinafter.

When a glaze is applied to a semiconductor device or to a silicon dioxide coating formed thereon and is then heated to distribute the glass over the device or coating, there is an initial tendency for the glass to ball up. As the temperature is increased, the glass spreads more readily over the surface thereunder. However, this higher temperature may undesirably modify the electrical characteristics of some semiconductor devices. It would, therefore, be desirable if the application of the glass jacket could be accomplished at a lower temperature and without balling so as to leave the electircal characteristics of the device virtually unimpaired. Also, when a thin layer of comminuted glass particles constitute the glass starting material that is to be fused to the silicon dioxide coating, the magnitude of the fusing temperature required for chemically bonding the glass to the silicon dioxide coating is related to the particle size. Larger particles require higher temperatures to fuse them into an integral coating. For some purposes the use of larger glass particles is desirable since they are less costly than their more finely divided glass counterparts.

It is an object of the invention, therefore, to provide a new and improved method of applying a protective glass jacket to the surface of an object so as to avoid one or more of the abovementioned disadvantages of prior such methods.

It is another object of the invention to provide a new and improved method of covering a surface of an object with a layer of glass, which method is effective to enhance the spreading of that layer and its uniformity.

It is a further object of the invention to provide a new and improved method of covering a surface of a semiconductor device, which method affords not only an excellent bond to the device but also accomplishes it at a lower glassing temperature.

It is also an object of the invention to provide a new and improved method of covering a surface of a semiconductor device with a glass jacket in a manner which permits the use of larger glass particles.

It is yet another object of the invention to provide an object with a new and improved glass coating thereover.

It is an additional object of the invention to provide a semiconductor device with a new and improved protective covering over the PN junctions thereof.

In accordance with a particular form of the invention, the method of covering a surface of a device with a protective glass jacket comprises coating that surface with a layer of an oxide that is effective to improve the spreading and smoothness of a layer of glass that is to be fused thereto, and fusing to aforesaid oxide layer a layer of glass at a temperature which is lower than that required to cover the surface in the absence of the aforesaid oxide layer.

Also in accordance with the invention, a coated object comprises a base member, a layer of an oxide adherent to a surface of that member, and a layer of glass chemically bonded to that oxide layer, the oxide layer being one which is effective during the bonding operation to reduce the surface tension of the glass at the interface of the layers and the required bonding temperature.

The foregoing and other objects, features and advantages of the invention will be apparent from the following more particular description of preferred embodiments of the invention, as illustrated in the accompanying drawings.

Figure 2:
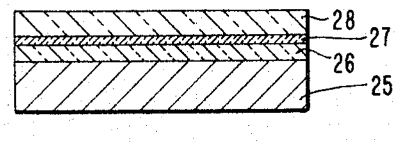
Figure 3:
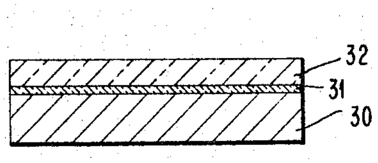

In the drawings:

FIGS. 1(*a*)–1(*f*) are sectional views representing a portion of an array of semiconductor devices during the various steps in the manufacture thereof;

FIG. 2 is a sectional view of a metallic object with a glass jacket thereon in accordance with a modification of the present invention; and FIG. 3 is a sectional view of another embodiment of the invention.

*Description of FIGS. 1(a)–1(f) semiconductor devices*

Referring now more particularly to FIGS. 1(*a*)–1(*f*) of the drawing, there is represented a fragmentary portion of a large array of semiconductor devices or diodes. An arrangement of this sort would result from the microminiaturized fabrication of those devices and could, for example, comprise several hundred semiconductor diodes formed on a single semiconductor member or substrate 10 of a suitable material such as germanium, silicon or an intermetallic semiconductor compound. Member 10 has a film 11 of an oxide coating formed thereon integral with its upper surface. While various oxide films may be used, this film is preferably a silicon dioxide film. When the member 10 is silicon, which it will be considered hereinafter, the film 11 is preferably a genetic layer formed from the parent silicon body or member by means other than by simply exposing a body to the atmosphere. This film may be derived from the member 10 by heating the body to between 900–1400° C. in an oxidizing atmosphere saturated with water vapor or steam. Patent 2,802,760 to Derick et al., granted August 13, 1957 and entitled "Oxidation of Semiconductor Surfaces for Controlled Diffusion," describes one such treatment. Although the exact chemical composition of the oxide film 11 is not known, it is believed that silicon dioxide is its major constituent. However, it will be referred to broadly in the claims as a silicon oxide film. Other films such as aluminum oxide have been employed with success in some applications.

Alternatively, an inert adherent coating or film which is believed to be mostly silicon dioxide 11 may be formed on the surface of the semiconductor member 10 by heating the latter in the vapors of an organic siloxane compound at a temperature below the melting point of the semiconductor but above that at which the siloxane decomposes, so that an inert film of silicon dioxide coats the desired surface. For example, member 10 may be heated for 10–15 minutes at about 700° C. in a quartz furnace containing triethoxysilane, using argon or helium as the carrier gas to sweep the siloxane fumes through the furnace. Since experience has indicated that silicon dioxide films made by the thermal-decomposition of an organic siloxane compound are somewhat less dense than those grown in an oxide atmosphere, a somewhat thicker film of the former is ordinarily employed. Such films are, however, particularly advantageous for application to germanium for the purposes under consideration.

Apertures 12, 12 are formed at predetermined locations in the film 11 by conventional photoengraving techniques. In a manner well known in the art, a photoengraving resist (not shown) is placed over the silicon dioxide film and the resist is then exposed through a master photographic plate having opaque areas corresponding to the regions from which the oxide film is to be removed. In the photographic development, the unexposed resist is removed and a corrosive fluid is employed to remove the oxide film from the now exposed regions while the developed resist serves as a mask to prevent the chemically etching of the oxide areas that are to remain on the silicon member 10.

In the next operation, a plurality of PN junctions 13, 13 (see FIG. 1(*b*)) are created in the member 10, which junctions extend to the upper surface 14 of that member. This is accomplished by a conventional diffusion operation wherein a suitable conductivity-determining impurity passes through the apertures 12, 12 and diffuses into the member 10 to establish therein regions 15, 15 of a conductivity type opposite to that of the member and to create the junctions 13, 13. The elevated temperature of the diffusion operation does not damage the silicon dioxide film 11, which preferably has a thickness at least at great as 1,000 angstroms and may be in the range of 1,000–30,000 angstroms, is impervious to the diffusing material and hence serves as a passivating and diffusion mask that confines the diffusion to predetermined areas on the surface 14 of the member 10. It will be observed that in the diffusion operation, the impurity creeps or diffuses for a short distance under the edge portion of the silicon dioxide film 11 which defines the apertures 12, 12. Silicon dioxide films having thicknesses in the range of 5,000–6,000 angstroms have proved to be very effective for their overall purpose in the present invention. Extensive work has been performed and excellent results obtained when the silicon dioxide films have a thickness of 5,000 angstroms, the thickness of the film being determined by the length of time that the silicon body 10 has been exposed at an elevated temperature to the highly oxidizing atmosphere employed in the formation of that film prior to the photoengraving and diffusing operations.

For some applications, particularly where the depth of diffusion in the establishment of the regions 15, 15 is not great, it may be desirable to reoxidize the upper surface of the FIG. 1(*b*) structure, thereby creating the thin silicon dioxide film 17 over the upper surface of the structure represented in FIG. 1(*c*). The buildup of the film 17 on the existing silicon dioxide film 11 is inherently slower than that portion 18 of the film appearing on the exposed surface of the semiconductor regions 15, and this is shown in the FIG. 1(*c*) representation. It will be understood, however, that except for the film portion 18, the remainder of the film 17 on the film 11 is actually integral with the latter and that no line of demarcation exists therebetween, although such a line has been shown in the drawing simply as an aid in the explanation and in the understanding of this operation. A steam oxidation treatment is effective in establishing the film 17. In connection with the two oxidation operations mentioned above with respect to the upper surface of the structure, silicon dioxide films are also created on the bottom surface of that structure. For the purpose of simplifying the representation, however, those films have been omitted since they are readily removed by a conventional lapping operation.

Next the film 17 and portion 18 thereof is coated with a layer 19 of an oxide (see FIG. 1(*d*)) that is effective to improve the spreading and the smoothing of a layer of glass that is subsequently to be fused to the oxide layer. Layer 19 desirably is an oxide selected from the group of lead oxide and bismuth trioxide and may be applied or formed on film 17 in a variety of ways. The lead oxide is believed to be mainly PbO. To that end, the selected oxide may be applied over the film 17 by well-known vacuum evaporation techniques to develop a film having a thickness in the range of from 400–1,000 angstroms. For some applications, it may be desirable to use thicker oxide films. In the operation under consideration, the oxide is deposited on the film surface directly, or the element lead or bismuth is evaporated in an oxygen atmosphere which is effective to convert the lead or the bismuth, as the case may be, to its oxide. Conventional sputtering of a lead or bismuth layer followed by its oxidation may also be practiced. Alternatively, the well-known procedure of reactive sputtering the element lead or bismuth in an oxygen atmosphere well may be followed in depositing the desired oxide layer 19. In a typical procedure, bismuth is evaporated on the structure represented in FIG. 1(*c*) in a conventional evaporator to form a coating of the desired thickness, and this is followed by the oxidation of the bismuth of a temperature of about 600° for approximately 30 minutes to form the layer 19 of FIG. 1(*d*). For convenience of explanation, oxide layer 19 will be considered hereinafter as one of bismuth trioxide.

In the next fabricating step, a thin glass layer 20 (see FIG. 1(*e*)) is chemically bonded to the bismuth trioxide layer 19. This may be accomplished by any of several well-known techniques such as spraying, sedimentation or silk screening followed by a firing process to form a glass layer that has a thickness in the range of 5,000–500,000 angstroms. Glass layer 20 having a thickness in the range of 20,000–50,000 angstroms has proved to be particularly effective, and a glass layer having a thickness of 30,000 angstroms has been very practical for use as a protective jacket for silicon diodes and transistors. Thicker glass jackets such as those having a thickness of 150,000 angstroms have proved useful for other applications. In general, the glass layer 20 has a thickness which is of the order of ten times greater than that of the oxide layer 19. A technique which has been employed with success applies a coating of powdered glass through a silk screen to the oxide layer 19 such that a coating of glass particles having a particle size less than 44 microns (i.e., particles passing through a 325 mesh screen) is deposited on the oxide layer. Thereafter heat is applied to the unit so that the temperature of the glass particles is slightly above the softening temperature of those particles. This causes the glass to flow and effectively coat the oxide layer 17 with a continuous layer 20 of glass as represented in FIG. 1(*e*). The temperature which is selected is such that the bismuth trioxide layer 19 improves the spreading and the smoothness of the glass layer, that temperature being approximately 50–80° lower than that required to coat the film 11 and the upper surface 14 of the semiconductor device with a layer of glass in the absence of the bismuth trioxide layer. Although the action of the bismuth trioxide is not fully understood, it is believed that it serves as a flux for the glass in the fusing operation. Its use affords a dramatic improvement in the spreading and wetting qualities of the glass on the surface of the silicon dioxide layer 11. Improved wetting and spreading minimizes the creation of undesirable pin holes in the glass and, in turn, assures a better quality glass jacket for the surface to device 10.

In order that the resultant semiconductor device or devices may operate satisfactorily over a wide range of temperatures without the creation of undesirable cracks in the glass which might impair the effectiveness of the hermetic glass seal, it is ordinarily desirable to select a glass having a thermal coefficient of expansion that substantially matches that of the silicon body 10. Chemical resistant glasses such as a boro-silicate-type glass have proved to be particularly attractive. Since silicon has a coefficient of linear expansion per degree centigrade of $32\times10^{-7}$, a borosilicate glass available to the trade as Corning 7740 or Pyrex and having a coefficient of expansion of $32.6\times10^{-7}$ is extremely desirable. However, it will be understood that various other types of glasses with thermal coefficients cinsiderably different from that of the semiconductor body may be employed, depending to some extent upon the thickness of the glass film which is laid down and the temperature range which the device may encounter during operation. It will be clear that undesirable strains in the glass may be reduced by choosing a rather close match of thermal coefficients of the glass and the semiconductor body. In general, when thinner glass films are employed as protective jackets in the environment under consideration, it is possible to have a greater mismatch in expansion coefficients between the substrate and the glass than can be tolerated with thicker glass films, without subjecting those films to harmful cracking. For example, Pemco 1117 glass, a lead borosilicate glass, has an expansion coefficient of $64\times10^{-7}$ per degree centigrade whereas a silicon substrate, has, as previously mentioned, an expansion coefficient of only $32\times10^{-7}$ per degree centigrade. Powdered Corning 7740 glass, which is a high temperature chemically resistant glass, having a particle size of several microns, has been employed with considerable success to form a protective glass jacket for semiconductor devices. Those particles are heated to about 870° C. for several minutes to effect a diffusion operation. This temperature is about 80° lower than that required to cover the surface of the device with glass in the absence of the oxide layer.

At this time it appears desirable to consider further the role of the silicon dioxide film system 11, 17, 18, the glass film 20, and their interrelationships. Because of its chemical inertness in the operating temperature range of a silicon semiconductor device, and also because of its physical stability and mechanical compatability with silicon, a borosilicate glass should be extremely desirable for use in the glassing of such a device. However, a borosilicate glass contains harmful impurities such as the P-type doping agent boron which prevents that glass from being applied or fused directly to a semiconductor device containing PN junctions without injuring those junctions by impairing the electrical characteristics of the semiconductor material and the devices therein. An inert oxide layer such as silicon dioxide is employed between the semiconductor surface and the glass protective layer so to avoid interaction between the glass and the semiconductor and deterioration of the device properties. Since the silicon dioxide layer system 11, 17, 18 represented in FIG. 1(*c*) is genetically derived from the parent body, it is intimately bonded thereto and is effectively an integral part thereof. Glass consists of a mixture of solid solution of various silicates with some excess silicon dioxide. Borosilicate glasses have part of that silicon dioxide replaced by boron oxide. When the borosilicate glass film 20 in FIG. 1(*e*) is fused to the silicon dioxide film system 11, 17, 18 via bismuth trioxide layer 19, the under surface of the glass film is believed to react chemically through the bismuth trioxide layer with the upper surface of the film system 11, 17, 18 and form a glass region having a reduced boron oxide content. An endeavor has been made to convey this change by diagrammatically representing in FIG. 1(*e*) that the oxide film 17, 18 is somewhat thinner than the corresponding film illustrated in FIG. 1(*c*). It will be recalled, however, that the silicon dioxide film system 11, 17, 18 is really one film of silicon dioxide. The under portion of the silicon dioxide system (i.e., the portion adjoining the silicon member 10) does not react chemically with the glass film, which during this fusing operation is at a temperature of about 50° C. above the softening temperature of the glass, depending upon the type of borosilicate glass which is being employed and the particle size thereof. Accordingly, the silicon dioxide film system, because of the buffering of its inner portion thereof, serves as a barrier layer or protective element which prevents the harmful impurities such as the P-type impurity boron in the glass from penetrating the silicon regions 10 and 15, interacting therewith, and impairing the precisely established electrical characteristics thereof. It should also be mentioned that fusing period is sufficiently short and the application temperatures of the borosilicate glass film 20 are sufficiently low with reference to a temperature which would adversely affect the device, that the fusing period and temperature are compatible with the technology employed in making silicon semiconductor devices. When the glass film cools to room temperature, it is integrally united or bonded with the silicon dioxide film system which in turn is intimately united with the silicon body. Thus there effectively exists over the silicon body, with its PN junctions coming to the surface of that body, a very thin protective layer which is chemically bonded to and integrally united with the surface of the body, is hole-free and impervious to external agents which might impair the electrical characteristics of the semiconductor devices in that body, and affords the desirable thermal and mechanical properties of a good protective jacket.

Before the semiconductor devices or diodes under consideration may be connected in circuit, it is necessary that they be supplied with suitable terminals. This is accomplished by etching holes through the glass and the silicon dioxide films so as to expose portions of the surfaces of the semiconductor regions 15, 15, and then applying ohmic contacts thereto and to the lower surface of the semiconductor base 10. FIG. 1(*f*) represents the resulting structure after those operations have been performed. A suitable acid such as hydrofluoric acid is employed to perform the etching operation, which is accomplished through openings in a conventional etching mask that is placed on the glass film 19 and is properly oriented with respect to the semiconductor regions 15, 15. The size of the apertures in the mask, together with the etching time and the concentration of the etching solution, are selected so that the silicon dioxide films 11 and 17 and some glass span the portions of the junction 13 which extends to the surface of the semiconductor body, as represented in FIG. 1(*f*). In that way the junction is provided with a coating of an inert protective material. Thereafter, a thin film 21 of a conductive metal is suitably deposited as by evaporation on the exposed surfaces of the semiconductor regions 15, 15 and on selected portions of the glass film 20 in the manner shown in FIG. 1(*f*). A conductive layer 22 is attached to the bottom surface of the semiconductor body as by soldering or by evaporation. Since the structure under consideration is but a portion of a large array of semiconductor devices on a single substrate or member 10, it may be desirable for some applications to sever the body in a conventional manner as by ultrasonic cutting or fracturing at prescribed regions such as along the broken line A—A to form a multiplicity of individual devices.

*Description of coated object of FIG. 2*

As previously indicated, the techniques of the present invention are not limited to use in connection with silicon or other semiconductor substrates. For some applications it may be desirable to provide an impervious protective glass coating to a base member such as a metal object. To that end, there is represented in FIG. 2 a metallic base member 25 which is to receive a thin impervious protective jacket on its upper surface. This may be accomplished conveniently by first depositing, as by evaporation or thermal decomposition on the member 25, a thin film 26 of either silicon monoxide or silicon dioxide having a suitable thickness such as in the range of 1,000–30,000 angstroms. Such a film will be tightly adherent to the base member 25. Thereafter, the glassing technique explained above may be employed to apply and bond to the film 26 a layer 27 of bismuth trioxide or lead oxide followed by a glass coating 28 having a thickness in the range of 5,000–500,000 angstroms. It will be realized that the base member must be one which is capable of withstanding a temperature at least as great as the softening temperature of the glass film 27 during application.

*Description of coated object of FIG. 3*

In FIG. 3 there is represented an object 30 which has a protective glass layer or jacket 32 applied without the use of a silicon oxide film. To that end, a bismuth trioxide layer 31 and the glass layer 32 are successively applied in the manner explained above to produce the resultant coated object.

While the invention has been particularly shown and described with reference to preferred embodiments, it will be understood by those skilled in the art that the foregoing and other changes in the form and details may be made therein without departing from the spirit and the scope of the invention.

What is claimed is:

1. The method of covering a surface of a device with a protective glass jacket comprising:
reactively cathode sputtering material from the group consisting of lead and bismuth in an oxygen atmosphere well to coat said surface with a layer of an oxide of said material; and
covering said oxide layer with a layer of borosilicate glass, said glass and the material of said device having thermal coefficients of expansion in the same general range, and
heating said layers to a temperature sufficient to cause said glass to flow and coat said surface of said device with a continuous layer of glass, said oxide layer functioning to improve the spreading and the smoothness of said glass layer at said temperature, which temperature is lower than that temperature required to cover said surface in the absence of said oxide layer.

2. The method of covering a surface of a device with a protective glass jacket comprising:
reactively cathode sputtering bismuth in an oxygen atmosphere well to coat said surface with a layer of bismuth trioxide; and
covering said bismuth trioxide layer with a layer of borosilicate glass, said glass and the material of said device having thermal coefficients of expansion in the same general range, and
heating said layers to a temperature sufficient to cause said glass to flow and coat said surface of said device with a continuous layer of glass, said oxide layer functioning to improve the spreading and the smoothness of said glass layer at said temperature, which temperature is lower than that temperature required to cover said surface in the absence of said oxide layer.

3. The method of claim 2, wherein the thickness of said layer of glass is of the order of ten times the thickness of said layer of bismuth trioxide.

4. The method of covering a surface of a device with a protective glass jacket comprising:
evaporating lead on said surface;
oxidizing said lead to coat said surface with a layer of lead oxide; and
covering said oxide layer with a layer of borosilicate glass, said glass and the materials of said device having thermal coefficients of expansion in the same general range, and
heating said layers to a temperature sufficient to cause said glass to flow and coat said surface of said device with a continuous layer of glass, said oxide layer functioning to improve the spreading and the smoothness of said glass layer at said temperature, which temperature is lower than that temperature required to cover said surface in the absence of said oxide layer.

5. The method of covering a surface of a device with a protective glass jacket comprising:
coating said surface with a layer of an oxide selected from the group consisting of lead oxide and bismuth trioxide;
covering said oxide layer with a layer of powdered borosilicate glass, said glass and the material of said device having thermal coefficients of expansion in the same general range; and
heating said layers to a temperature sufficient to cause said glass to flow and coat said surface of said device with a continuous layer of glass, said oxide layer functioning to improve the spreading and the smoothness of said glass layer at said temperature, which temperature is lower than that temperature required to cover said surface in the absence of said oxide layer.

6. The method of covering a surface of a device with a protective glass jacket comprising:
coating said surface with a layer of an oxide selected from the group consisting of lead oxide and bismuth trioxide;
covering said oxide layer with a layer of powdered borosilicate glass having a thermal coefficient of expansion per degree centrigrade of $32.6 \times 10^{-7}$ and a particle size of several microns; and heating said layers to a temperature of about 870° C. to cause said glass to flow and coat said oxide layer with a continuous layer of glass, said temperature enabling said oxide layer to improve the spreading and the smoothness of said glass layer but being about 80° C. lower than that required to cover said surface in the absence of said oxide layer.

7. The method of covering a surface of a device with a protective glass jacket comprising:

evaporating a film of bismuth having a thickness in the range of 400–1,000 angstroms on said surface;

heating said bismuth on said surface in an oxygen atmosphere at about 600° C. for about 30 minutes to coat said surface with a layer of bismuth trioxide;

covering said oxide layer with a layer of powdered high melting-point borosilicate glass having a thickness, sufficient to form when heated to a temperature establishing glass flow, a resultant thickness not greater than 150,000 angstroms; and heating said layers to a temperature sufficient to cause said glass to flow and coat said surface of said device with a continuous layer of glass, said bismuth trioxide layer functioning to improve the spreading and the smoothness of said glass layer at said temperature, which temperature is lower than that temperature required to cover said surface in the absence of said bismuth trioxide layer.

8. The method of covering with a protective glass jacket a surface of a semiconductor device having a PN junction exposed at said surface comprising:

coating said surface with a film of silicon oxide;

coating said film with a layer of an oxide selected from the group consisting of lead oxide and bismuth trioxide; and coating said oxide layer with a layer of borosilicate glass, said glass and the material of said device having thermal coefficients of expansion in the same general range, and heating said layers to a temperature sufficient to cause said glass to flow and coat said surface of said device with a continuous layer of glass, said oxide layer functioning to improve the spreading and the smoothness of said glass layer at said temperature, which temperature is lower than that temperature required to cover said surface in the absence of said oxide layer.

9. The method of covering with a protective glass jacket a surface of a silicon semiconductor device having a PN junction exposed at said surface comprising:

growing on said surface a film of silicon dioxide having a thickness at least as great as 1,000 angstroms;

coating said film with a layer of an oxide selected from the group consisting of lead oxide and bismuth trioxide and having a thickness in the range of from 400–1,000 angstroms; and covering said oxide layer with a layer of borosilicate glass, said glass and the material of said device having thermal coefficients of expansion in the same general range, and heating said layers to a temperature sufficient to cause said glass to flow and coat said surface of said device with a continuous layer of glass, said oxide layer functioning to improve the spreading and the smoothness of said glass layer at said temperature, which temperature is lower than that temperature required to cover said surface in the absence of said oxide layer.

10. The method of covering with a protective glass jacket a surface of a semiconductor device having a PN junction exposed at said surface comprising:

thermally decomposing a siloxane compound in an inert atmosphere to coat said surface with a film of silicon oxide;

coating said film with a layer of an oxide selected from the group consisting of lead oxide and bismuth trioxide; and covering said oxide layer with a layer of borosilicate glass, said glass and the material of said device having thermal coefficients of expansion in the same general range, and heating said layers to a temperature sufficient to cause said glass to flow and coat said surface of said device with a continuous layer of glass, said oxide layer functioning to improve the spreading and the smoothness of said glass layer at said temperature, which temperature is lower than that temperature required to cover said surface in the absence of said oxide layer.

11. The method of covering with a protective glass jacket a surface of a silicon semiconductor device having a PN junction exposed at said surface comprising:

oxidizing said surface to establish thereon a film of silicon dioxide having a thickness at least as great as 1,000 angstroms;

coating said film with a layer of an oxide selected from the group consisting of lead oxide and bismuth trioxide and having a thickness of from 400–1,000 angstroms;

applying to said oxide layer through a silk screen a layer of powdered borosilicate glass having a particle size in the range of 5–10 microns; and said glass and the material of said device having thermal coefficients of expansion in the same general range;

heating said layers to a temperature sufficient to cause said glass to flow and coat said surface of said device with a continuous layer of glass, said oxide layer functioning to improve the spreading and the smoothness of said glass layer at said temperature, which temperature is lower than that temperature required to cover said surface in the absence of said oxide layer.

12. A coated object comprising:

a base member;

a film of an oxide adherent to a surface of said member;

a layer of an oxide selected from the group consisting of lead oxide and bismuth trioxide adherent to said film; and a layer of borosilicate chemically bonded to said oxide layer, said glass and the material of said base member having thermal coefficients of expansion in the same general range.

13. The method of covering a surface of a device with a protective glass jacket comprising:

coating said surface with a layer of an oxide selected from the group consisting of lead oxide, bismuth trioxide and mixtures thereof;

covering said oxide layer with a layer of borosilicate glass, said glass and the material of said device having thermal coefficients of expansion in the same general range; and heating said layers to a temperature sufficient to cause said glass to flow and coat said surface of said device with a continuous layer of glass, said oxide layer functioning to improve the spreading and the smoothness of said glass layer at said temperature, which temperature is lower than the temperature required to cover said surface in the absence of said oxide layer.

14. The method of claim 13 wherein said oxide layer has a thickness in the range of 400–1,000 angstroms, and said layer of borosilicate glass has an initial thickness at least as great as 5,000 angstroms.

15. The method of claim 13 wherein said glass layer is formed by applying through a silk screen a layer of powdered glass, and said temperature at which said layers are heated is 50–80° C. lower than that required to cover said surface in the absence of said oxide layer.

References Cited by the Examiner

UNITED STATES PATENTS

| | | | |
|---|---|---|---|
| 2,927,048 | 3/1960 | Pritikin | 117—215 |
| 3,170,813 | 2/1965 | Duncan et al. | 117—215 |

FOREIGN PATENTS

| | | |
|---|---|---|
| 558,685 | 6/1958 | Canada. |

RALPH S. KENDALL, *Primary Examiner.*

WILLIAM L. JARVIS, ALFRED L. LEAVITT, *Examiners.*